US010704983B1

(12) United States Patent
Tian et al.

(10) Patent No.: US 10,704,983 B1
(45) Date of Patent: Jul. 7, 2020

(54) SERVER

(71) Applicants: Inventec (Pudong) Technology Corporation, Shanghai (CN); INVENTEC CORPORATION, Taipei (TW)

(72) Inventors: Guang-Zhao Tian, Shanghai (CN); Zhao Geng, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/571,314

(22) Filed: Sep. 16, 2019

(30) Foreign Application Priority Data

Sep. 5, 2019 (CN) .......................... 2019 1 0836306

(51) Int. Cl.
| H05K 7/20 | (2006.01) |
| G01M 3/40 | (2006.01) |
| H01R 12/72 | (2011.01) |
| H01R 12/75 | (2011.01) |

(52) U.S. Cl.
CPC ............ *G01M 3/40* (2013.01); *H01R 12/722* (2013.01); *H01R 12/75* (2013.01); *H05K 7/20772* (2013.01); *H05K 7/20781* (2013.01); *H01R 2201/20* (2013.01)

(58) Field of Classification Search
CPC ....... G01M 3/40; H01R 12/722; H01R 12/75; H01R 2201/20; H05K 7/20772; H05K 7/20781; H05K 7/20809; H05K 7/20828; H05K 7/20836
See application file for complete search history.

(56) References Cited

U.S. PATENT DOCUMENTS

| 2005/0092070 A1* | 5/2005 | Bhatti ................... G01M 3/045 73/40 |
| 2005/0211466 A1* | 9/2005 | Kayser ................. G01D 11/245 174/261 |
| 2014/0015511 A1* | 1/2014 | Matthe ................ H01M 10/425 324/71.1 |
| 2014/0251583 A1* | 9/2014 | Eriksen ..................... G06F 1/20 165/104.33 |
| 2016/0242319 A1* | 8/2016 | Edwards ............ H05K 7/20781 |
| 2017/0181329 A1* | 6/2017 | Shelnutt ............. H05K 7/20763 |

(Continued)

FOREIGN PATENT DOCUMENTS

| TW | M573429 U | 1/2019 |
| WO | 2018069635 A1 | 4/2018 |

OTHER PUBLICATIONS

Taiwan Patent Office, "Office Action", dated Mar. 20, 2020, Taiwan.

*Primary Examiner* — Jacob R Crum
(74) *Attorney, Agent, or Firm* — Locke Lord LLP; Tim Tingkang Xia, Esq.

(57) ABSTRACT

This disclosure relates to a server includes a chassis, a processor, a liquid cooling tube and a liquid leak detection system. The processor is disposed in the chassis. The liquid cooling tube is disposed on the processor. The liquid leak detection system includes a circuit board and a first detecting wire. The circuit board is disposed in the chassis. The first detecting wire is disposed on a side of the liquid cooling tube and electrically connected to the circuit board.

9 Claims, 7 Drawing Sheets

(56) References Cited

U.S. PATENT DOCUMENTS

| | | | | |
|---|---|---|---|---|
| 2018/0246048 A1* | 8/2018 | Sakunenko | ........... | G01N 27/048 |
| 2018/0303010 A1* | 10/2018 | Kerner | ................ | H05K 5/0217 |
| 2019/0094097 A1* | 3/2019 | Cavalheiro | ............ | G08B 21/20 |
| 2019/0364699 A1* | 11/2019 | Gao | ................... | H05K 7/20272 |

* cited by examiner

SERVER

CROSS-REFERENCE TO RELATED APPLICATIONS

This non-provisional application claims priority under 35 U.S.C. § 119(a) on Patent Application Ser. No(s). 201910836306.3 filed in China, P.R.C. on Sep. 5, 2019, the entire contents of which are hereby incorporated by reference.

Technical Field

The present disclosure relates to a sever, more particularly to a server having liquid leak detection system.

Background

As the performance of electronic components, such as processers of servers, progresses, massive heat will be generated during operation. As a result, air cooling system is unable to effectively cool the electronic components. To solve this problem, more and more people turn to liquid cooling. The liquid cooling uses liquid to absorb and take away waste heat and which is a more efficient way for heat dissipation than air cooling.

SUMMARY

According to one aspect of the present disclosure, a server includes a chassis, a processor, a liquid cooling tube and a liquid leak detection system. The processor is disposed in the chassis. The liquid cooling tube is disposed on the processor. The liquid leak detection system includes a circuit board and a first detecting wire. The circuit board is disposed in the chassis and the first detecting wire is disposed on a side of the liquid cooling tube and electrically connected to the circuit board.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
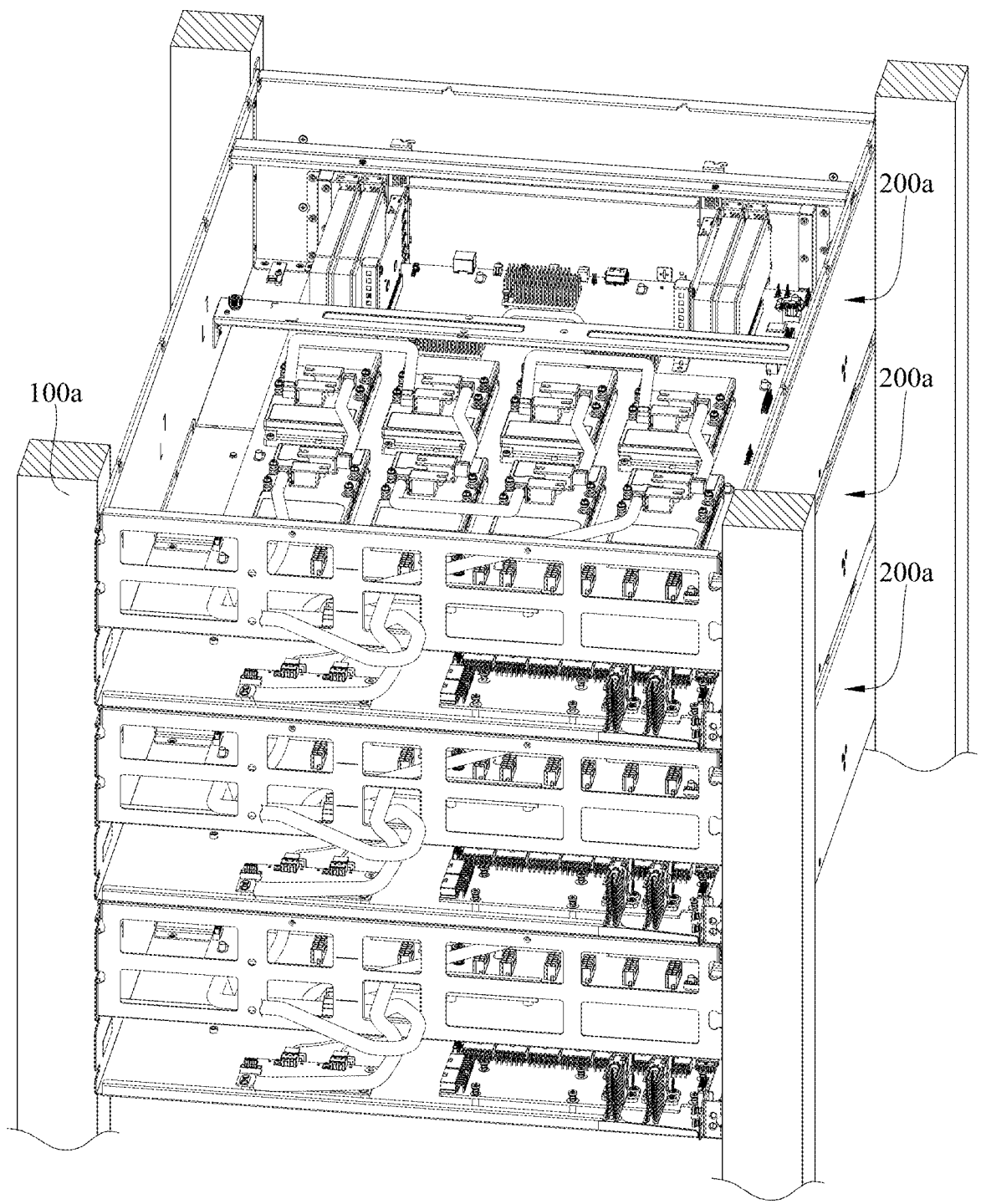
FIG. 1 is a perspective view of a server according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
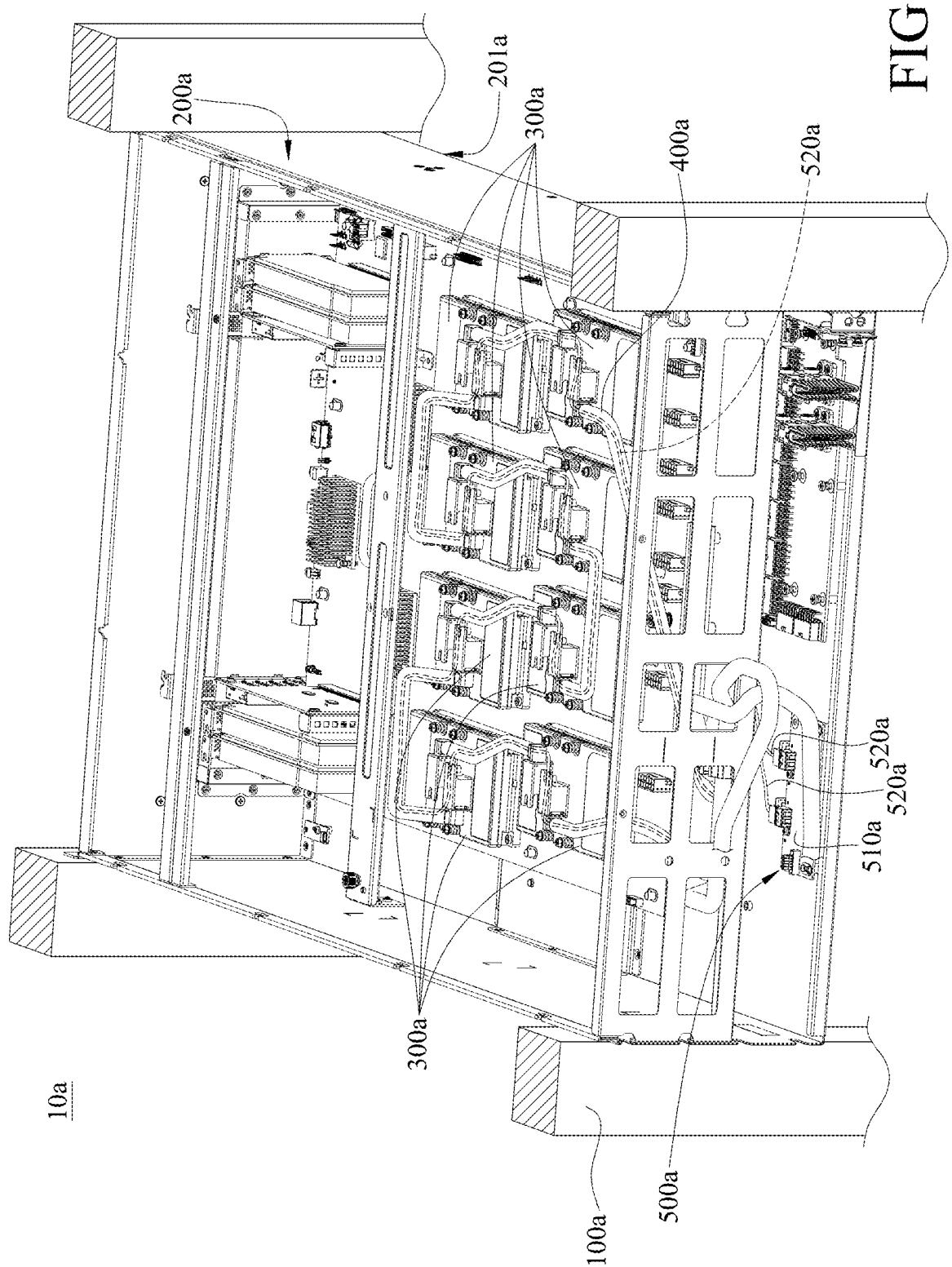
FIG. 2 is a partially perspective view of the server in FIG. 1.
Figure 3:
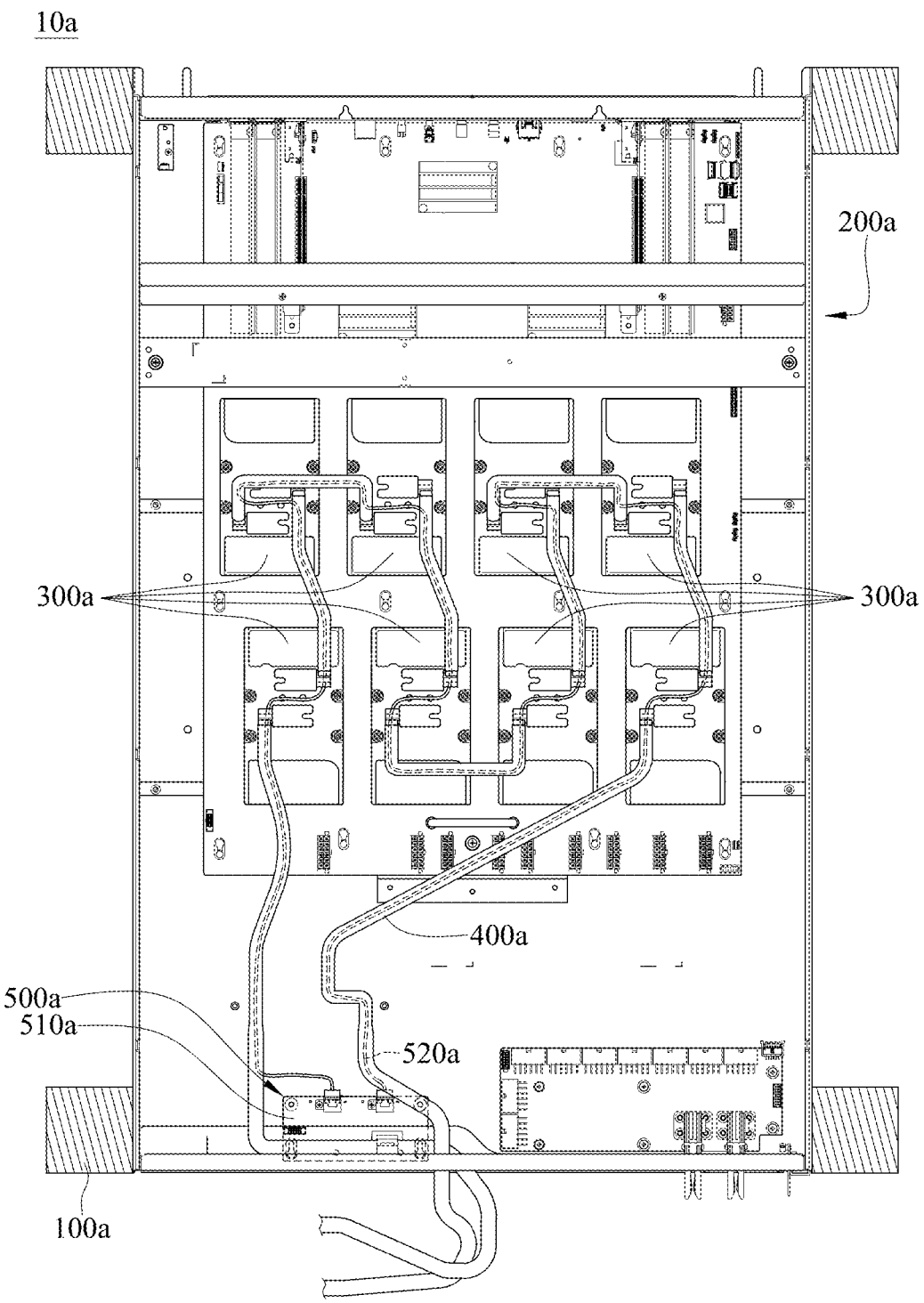
FIG. 3 is a plan view of the server in FIG. 2.

Please refer to FIG. 1 to FIG. 3. FIG. 1 is a perspective view of a server 10a according to an embodiment of the present disclosure. FIG. 2 is a partially perspective view of the server 10a in FIG. 1. FIG. 3 is a plan view of the server 10a in FIG. 2.

In this embodiment, the server 10a includes a cabinet 100a, at least one chassis 200a, at least one processor 300a, at least one liquid cooling tube 400a and at least one liquid leak detection system 500a. The chassis 200a are disposed in the cabinet 100a. The processors 300a are, for example, computing electrical devices that will generate massive heat during operation, and the processors 300a are disposed in the chassis 200a. The liquid cooling tubes 400a are disposed on the processors 300a. The cooling liquid (not shown) flowing in the liquid cooling tubes 400a can absorb and take away the heat generated by processors 300a. The liquid leak detection systems 500a are disposed in the chassis 200a.

Note that the disclosure is not limited to the quantities of the chassis 200a, the processors 300a, the liquid cooling tubes 400a and the liquid leak detection systems 500a. In some embodiments, the server may only include one chassis, one processor, one liquid cooling tube and one liquid leak detection system. For simplicity, only one of the chassis 200a, one of the components in the one of the chassis 200a (e.g., the processors 300a), the liquid cooling tube 400a and the liquid leak detection system 500a, are illustrated hereinafter.

In this embodiment, the liquid leak detection system 500a disposed in the chassis 200a is configured to detect the existence of liquid leak of the liquid cooling tube 400a. Specifically, the liquid leak detection system 500a includes a circuit board 510a and a first detecting wire 520a. The circuit board 510a is disposed in the chassis 200a. The first detecting wire 520a is disposed on a side of the liquid cooling tube 400a and electrically connected to the circuit board 510a. The liquid leak detection system 500a is able to detect the existence of liquid leak of the liquid cooling tube 400a by the first detecting wire 520a and to transmit the detection result to the circuit board 510a via the first detecting wire 520a.

Figure 4:
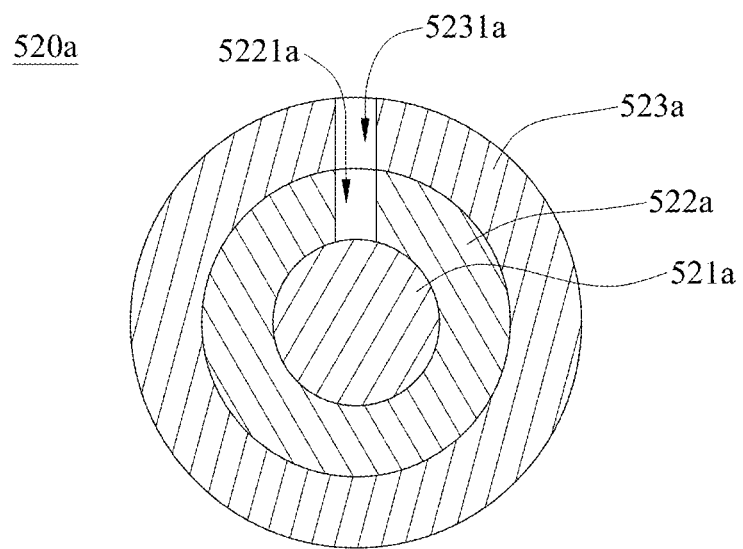
FIG. 4 is a front cross-sectional view of a first detecting wire of the server in FIG. 2.
Figure 5:
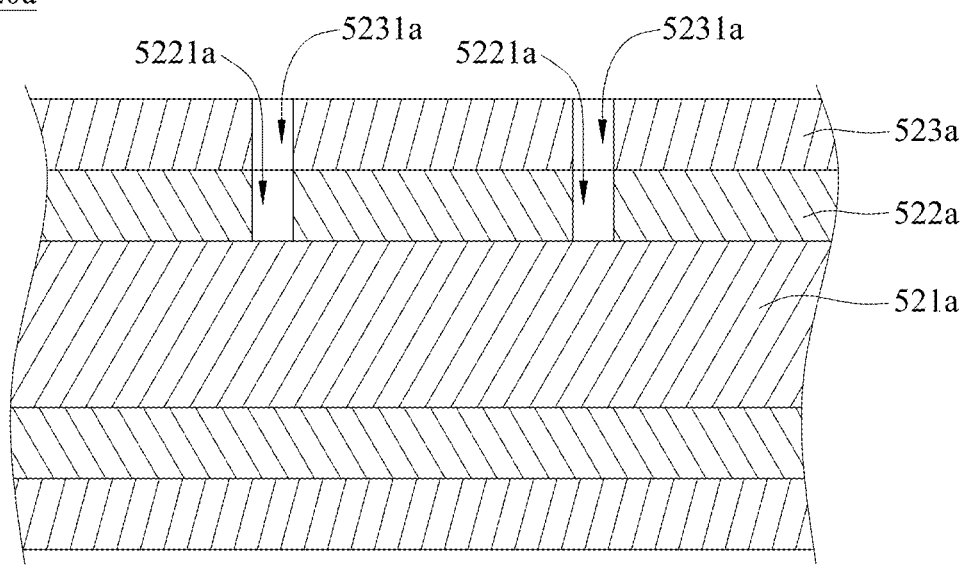
FIG. 5 is a side cross-sectional view of the first detecting wire of the server in FIG. 2.

To describe how the existence of liquid leak is detected by the first detecting wire 520a, please refer to FIG. 4 and FIG. 5. FIG. 4 is a front cross-sectional view of the first detecting wire 520a of the server 10a in FIG. 2. FIG. 5 is a side cross-sectional view of the first detecting wire 520a of the server 10a in FIG. 2. As shown in FIG. 4, in this and some embodiments, the first detecting wire 520a may further include a core 521a, an insulation layer 522a and a cover layer 523a. The core 521a is located in the insulation layer 522a, and the insulation layer 522a is located in the cover layer 523a. That is, the first detecting wire 520a sequentially includes, from the inside to the outside, the core 521a, the insulation layer 522a and the cover layer 523a.

The insulation layer 522a has at least one first opening 5221a, and the cover layer 523a has at least one second opening 5231a. Note that the disclosure is not limited to the quantities of the first openings 5221a and the second openings 5231a. In some embodiments, the insulation layer may only have one first opening and the cover layer may only have one second opening. In this and some embodiment, the first openings 5221a are connected to the second openings 5231a, and the first openings 5221a and the second openings 5231a expose the core 521a.

The core 521a is made of, for example, stainless steel and has electrical conductivity. The insulation layer 522a has electrical insulation. The cover layer 523a is made of, for example, nylon and has electrical insulation. The cover layer 523a includes capillary structure (not shown). Therefore, cooling liquid that leaks from the liquid cooling tube 400a can be absorbed by the capillary structure of the cover layer 523a and diffused in the cover layer 523a. The cooling liquid in the cover layer 523a may be diffused to the second openings 5231a and then may be flowed to the core 521a via the first openings 5221a such that the resistance of the core 521a is changed. The change of the resistance of the core 521a changes the electrical conductivity of the core 521a and can be detected by the circuit board 510a. This is considered as a result of the existence of liquid leak of the liquid cooling tube 400a and can be transferred to the circuit board 510a. That is, the circuit board 510a is able to detect the existence of liquid leak of the liquid cooling tube 400a.

Furthermore, the electrical insulation of the insulation layer 522a prevents the cooling liquid from being electrically connected to the core 521a. The cooling liquid has to flow to the first openings 5221a and the second openings 5231a to change the electrical conductivity of the core 521a. Therefore, the electrical conductivity of the core 521a may not be easily changed by the moisture in the outside environment so as to secure the sensitivity of the liquid leak detection system 500a and reduce the possibility of erroneous detection. However, in some embodiments, the first detecting wire may not have the insulation layer and the cover layer, and the core may be used to directly detect the existence of liquid leak.

In this and some embodiment, the first openings 5221a may be spaced apart from one another by approximately 25 mm, and the second openings 5231a may be spaced apart from one another by approximately 25 mm. This configuration ensures a sufficient amount of the first openings 5221a and the second openings 5231a for detection. Optionally, the first openings 5221a and the second openings 5231a may be positioned closer to the area of the liquid cooling tube 400a which easily occurs leakage.

Please refer to FIG. 2 and further refer to FIG. 4 and FIG. 5. In this and some embodiments, the chassis 200a has a bottom surface 201a. The server 10a may be placed on a platform such as a table in a way that the bottom surface 201a of the chassis 200a faces the platform. The first detecting wire 520a is located closer to the bottom surface 201a of the chassis 200a than the liquid cooling tube 400a. Accordingly, the cooling liquid that leaks from the liquid cooling tube 400a will drop toward the bottom surface 201a and be easily absorbed by the cover layer 523a, and thus the existence of liquid leak may be easily detected by the aforementioned way.

Figure 6:
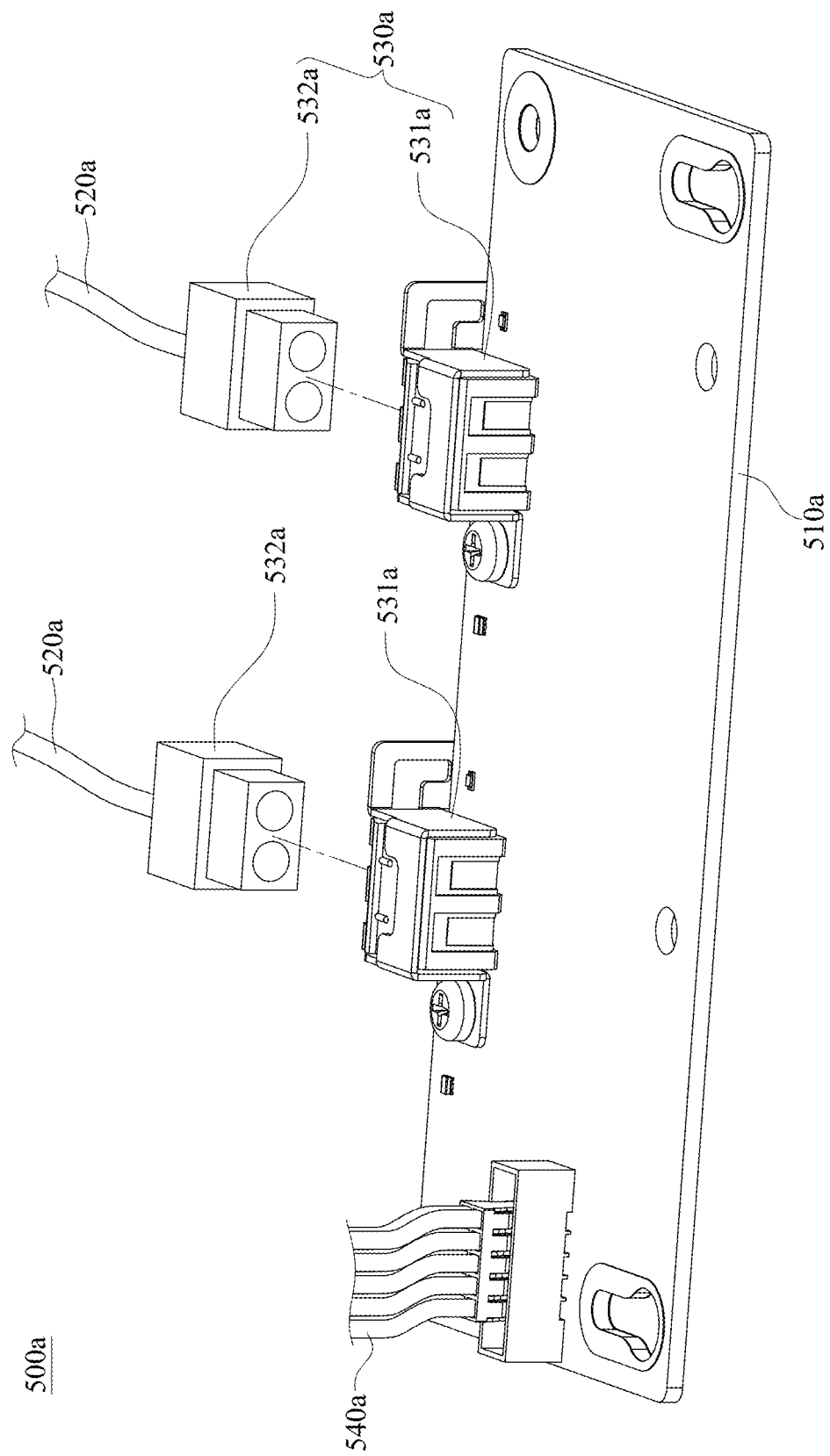
FIG. 6 is a perspective view of a liquid leak detection system of the server in FIG. 2.

Please refer to FIG. 2 and further refer to FIG. 6. FIG. 6 is a perspective view of a liquid leak detection system 500a of the server 10a in FIG. 2. In this and some embodiments, the liquid leak detection system 500a may further include at least one connector 530a. Each of the connectors 530a may be a pair of screw terminals and includes a female connector 531a and a male connector 532a. The female connector 531a may be disposed on the circuit board 510a. The first detecting wire 520a may be disposed to the male connector 532a by screwing. The male connector 532a may be removably connected to the female connector 531a so as to electrically connect the first detecting wire 520a to the circuit board 510a. Accordingly, the first detecting wire 520a can be electrically connected to the circuit board 510a in a fast and easy manner, and the first detecting wire 520a is configured to transmit the detection result to the circuit board 510a.

The liquid leak detection system 500a may further include a signal wire 540a electrically connected to the circuit board 510a and the processors 300a. When the existence of liquid leak of the liquid cooling tube 400a is detected by the liquid leak detection system 500a, the signal wire 540a is able to transmit the detection result to the processor 300a, and then the processor 300a can send a control signal to stop the circulation of the cooling liquid so as to prevent liquid leak from being more serious, or can send a visual/audible warning to the user to take appropriate actions.

Figure 7:
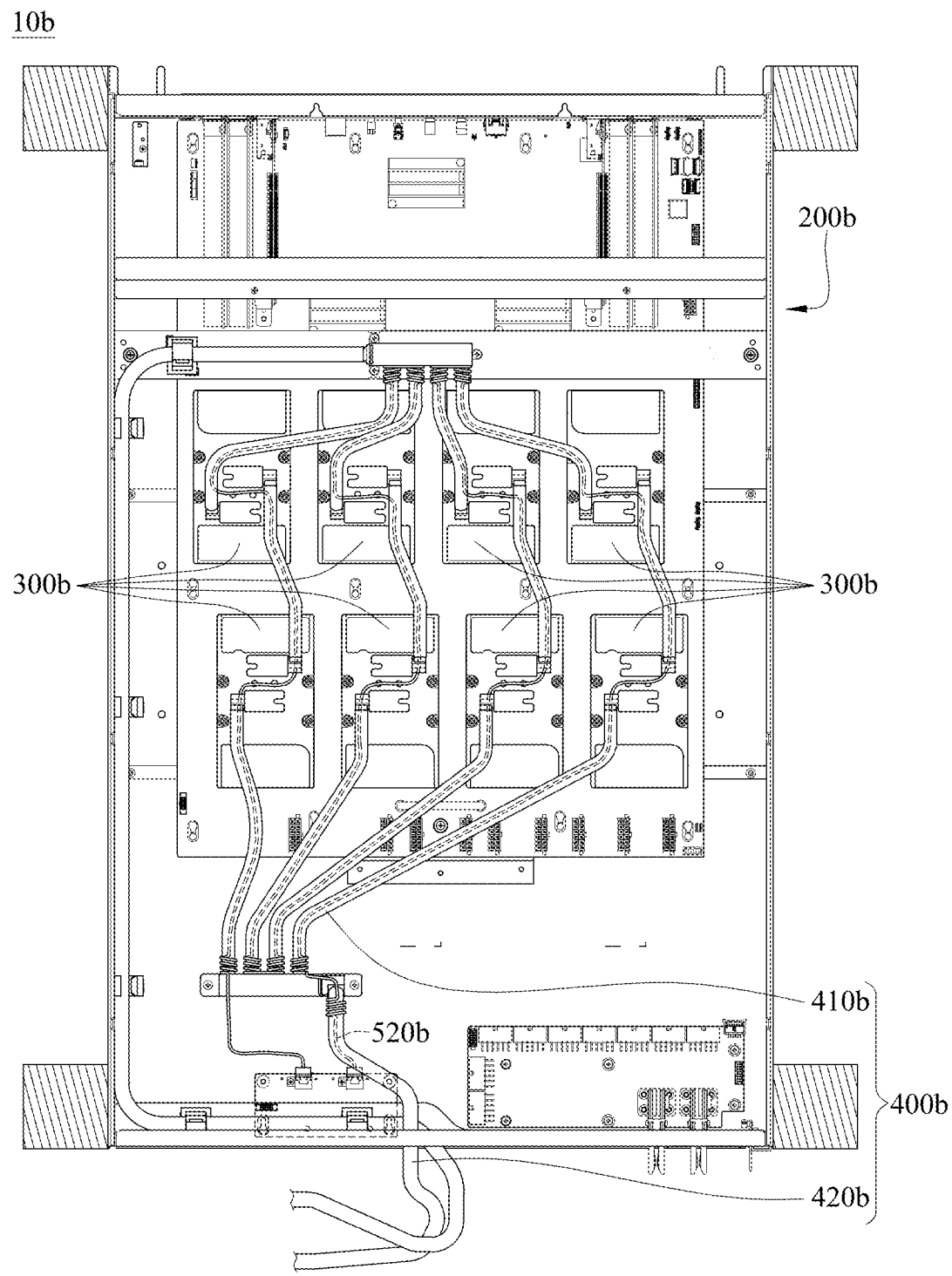
FIG. 7 is a plain view of a server according to another embodiment of the present disclosure.

Please refer to FIG. 7. FIG. 7 is a plain view of a server 10b according to another embodiment of the present disclosure. Note that only the differences between this and the previous embodiments are illustrated hereinafter. In this and some embodiments, the liquid cooling tube 400b may have difference inner diameters in consideration of the flow rate of the cooling liquid. Specifically, the liquid cooing tube 400b may further include a first tube portion 410b and a second tube portion 420b. The first tube portion 410b is disposed on the processor 300b, and the second tube portion 420b is disposed through the chassis 200b. The first tube portion 410b is connected to the second tube portion 420b, and an inner diameter of the first tube portion 410b is smaller than an inner diameter of the second tube portion 420b. The first detecting wire 520b is disposed on a side of the first tube portion 410b and the second tube portion 420b and is wound around a joint between the first tube portion 410b and the second tube portion 420b. Usually, liquid leak occurs more frequently at the joint between two tubes (e.g., the joint between the first tube portion 410b and the second tube portion 420b), winding the first detecting wire 520b around the joint helps to secure the liquid leak detection.

Figure 8:
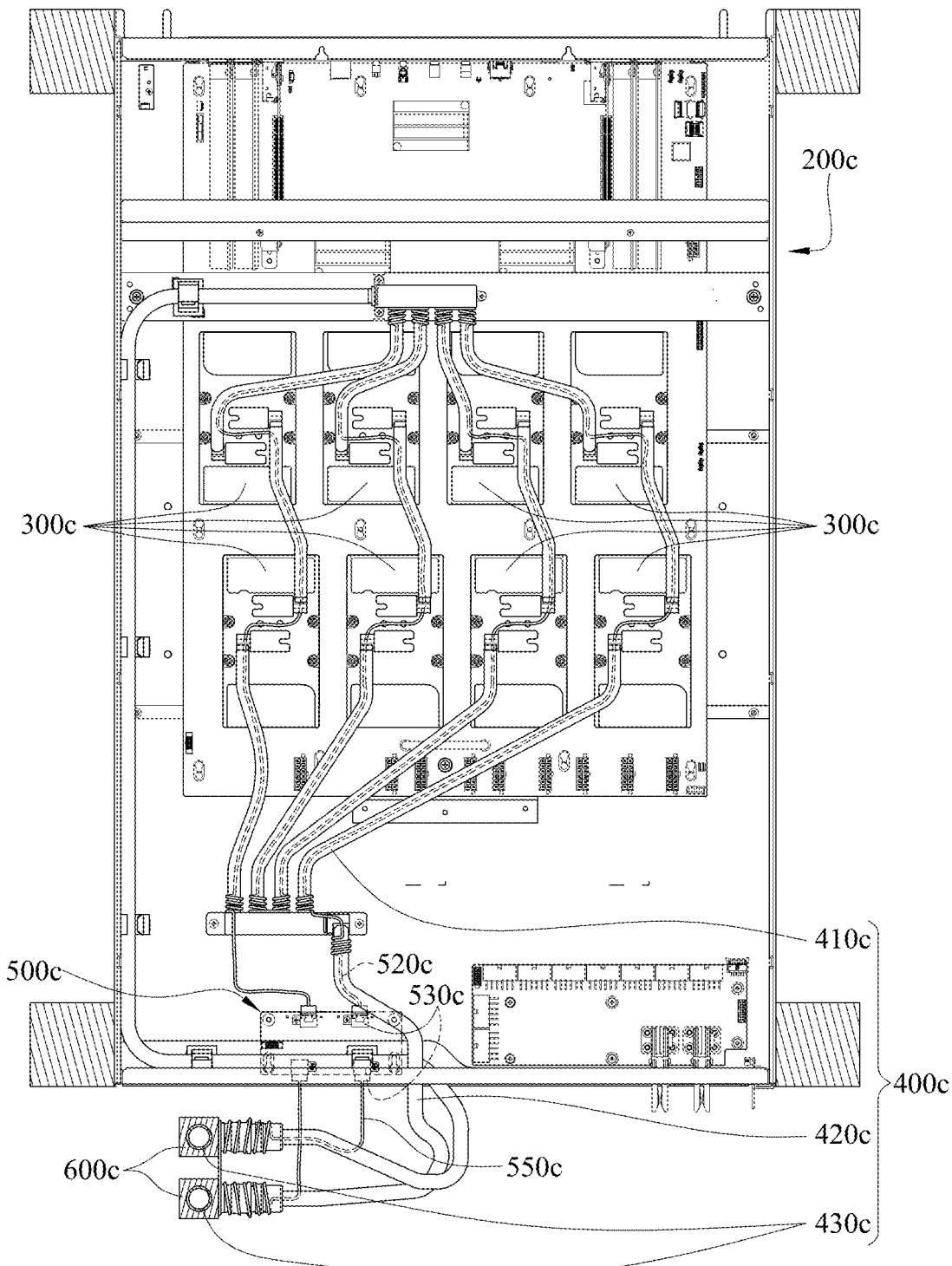
FIG. 8 is a plan view of a server according to further another embodiment of the present disclosure.

Please refer to FIG. 8. FIG. 8 is a plan view of a server 10c according to further another embodiment of the present disclosure. Note that only the differences between this and the previous embodiments are illustrated hereinafter. In this and some embodiments, the liquid cooling tube 400c may have difference inner diameters in consideration of the flow are of the cooling liquid. Specifically, the server 10c may further include a rack manifold 600c. The liquid cooling tube 400c may further include a first tube portion 410c, a second tube portion 420c and a third tube portion 430c. The liquid leak detection system 500c may further include a second detecting wire 550c. The first tube portion 410c is disposed on the processor 300c, the second tube portion 420c is disposed through the chassis 200c, and the third tube portion 430c is disposed in the rack manifold 600c. The first tube portion 410c, the second tube portion 420c and the third tube portion 430c are connected to one another. An inner diameter of the first tube portion 410c is smaller than an inner diameter of the second tube portion 420c, the inner diameter of the second tube portion 420c is smaller than an inner diameter of the third tube portion 430c. The first detecting wire 520c is disposed on a side of the first tube portion 410c and the second tube portion 420c and is wound around a joint between the first tube portion 410c and the second tube portion 420c. The second detecting wire 550c is wound around a joint between the second tube portion 420c and the third tube portion 430c. Usually, liquid leak occurs more frequently at the joint between two tubes (e.g., the joint between the first tube portion 410c and the second tube portion 420c and the joint between the second tube portion 420c and the third tube portion 430c), winding the first detecting wire 520c and the second detecting wire 550c around the joints helps to secure the liquid leak detection.

According to the server discussed above, the liquid leak detection system disposed in the chassis is able to detect the existence of liquid leak of the liquid cooling tube by the first detecting wire and to transmit the detection result to the circuit board via the first detecting wire.

In some embodiments, the first detecting wire may further include a core, an insulation layer and a cover layer. Cooling liquid that leaks from the liquid cooling tube can be absorbed by the capillary structure of the cover layer and diffused in the cover layer. The cooling liquid in the cover layer may be diffused to the second openings and then may be flowed to the core via the first openings such that the resistance of the core is changed. This is considered as a result of the existence of liquid leak of the liquid cooling tube and can be transferred to the circuit board.

In some embodiments, the chassis has a bottom surface. The cooling liquid that leaks from the liquid cooling tube will drop toward the bottom surface and be easily absorbed by the cover layer, and thus the existence of liquid leak may be easily detected by the aforementioned way.

In some embodiments, the liquid leak detection system may further include a signal wire. The signal wire is able to transmit the detection result to the processor, and then the processor can send a control signal to stop the circulation of the cooling liquid so as to prevent liquid leak from being more serious, or can send a visual/audible warning to the user to take appropriate actions.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A server, comprising:
   a chassis;
   a processor, disposed in the chassis;
   a liquid cooling tube, disposed on the processor; and
   a liquid leak detection system, comprising a circuit board and a first detecting wire, wherein the circuit board is disposed in the chassis, and the first detecting wire is disposed on a side of the liquid cooling tube and electrically connected to the circuit board;
   wherein the liquid cooling tube further comprises a first tube portion and a second tube portion, the first tube portion is disposed on the processor, the second tube portion is disposed through the chassis, the first tube portion is connected to the second tube portion, an inner diameter of the first tube portion is smaller than an inner diameter of the second tube portion, the first detecting wire is disposed on a side of the first tube portion and the second tube portion and is wound around a joint between the first tube portion and the second tube portion.

2. The server according to claim 1, wherein the first detecting wire further comprises a core, an insulation layer and a cover layer, the core has electrical conductivity and is located in the insulation layer, the insulation layer is located in the cover layer, the insulation layer and the cover layer both have electrical insulation, the insulation layer has at least one first opening, the cover layer has at least one second opening connected to the at least one first opening, and the at least one first opening and the at least one second opening expose the core.

3. The server according to claim 2, wherein a quantity of the at least one first opening is plural, the first openings are spaced apart from one another, a quantity of the at least one second opening is plural, and the second openings are spaced apart from one another.

4. The server according to claim 2, wherein the cover layer comprises a capillary structure.

5. The server according to claim 2, wherein the core is made of stainless steel, and the cover layer is made of nylon.

6. The server according to claim 1, further comprising a rack manifold, wherein the liquid cooling tube further comprises a third tube portion, the liquid leak detection system further comprises a second detecting wire, the third tube portion is disposed in the rack manifold, the first tube portion, the second tube portion and the third tube portion are connected to one another, the inner diameter of the second tube portion is smaller than an inner diameter of the third tube portion, and the second detecting wire is wound around a joint between the second tube portion and the third tube portion.

7. The server according to claim 1, wherein the liquid leak detection system further comprises a connector disposed on the circuit board, and the first detecting wire is disposed to the connector and is electrically connected to the circuit board via the connector.

8. The server according to claim 1, wherein the liquid leak detection system further comprises a signal wire electrically connected to the circuit board and the processor.

9. The server according to claim 1, wherein the chassis further has a bottom surface, and the first detecting wire is closer to the bottom surface than the liquid cooling tube.

* * * * *